Dec. 10, 1968 D. E. BLACKMER 3,416,093

HIGH PERFORMANCE DC AMPLIFIER CIRCUIT HAVING INHERENTLY LOW OFFSET CURRENT

Filed Feb. 2, 1966

United States Patent Office 3,416,093

Patented Dec. 10, 1968

3,416,093

HIGH PERFORMANCE DC AMPLIFIER CIRCUIT HAVING INHERENTLY LOW OFFSET CURRENT

David E. Blackmer, Weston, Mass., assignor to Instrumentation Laboratory, Inc., Watertown, Mass., a corporation of Massachusetts Filed Feb. 2, 1966, Ser. No. 524,533
9 Claims. (Cl. 330—23)

ABSTRACT OF THE DISCLOSURE

A high performance DC amplifier has an input stage that includes an N channel junction field effect transistor. Connected across the source drain channel is the emitter base junction of an NPN transistor and an adjusting network of two resistors and a potentiometer. The output of the input stage is supplied to a bilateral class B amplifier. Potentiometric feedback is employed and a forward biased condition of the gate electrode of the field effect transistor is established to maintain the gate electrode at its floating potential. The circuitry exhibits a zero current offset characteristic with a typical temperature coefficient of $10^{-14}$ ampere per ° C.

Figure 1:
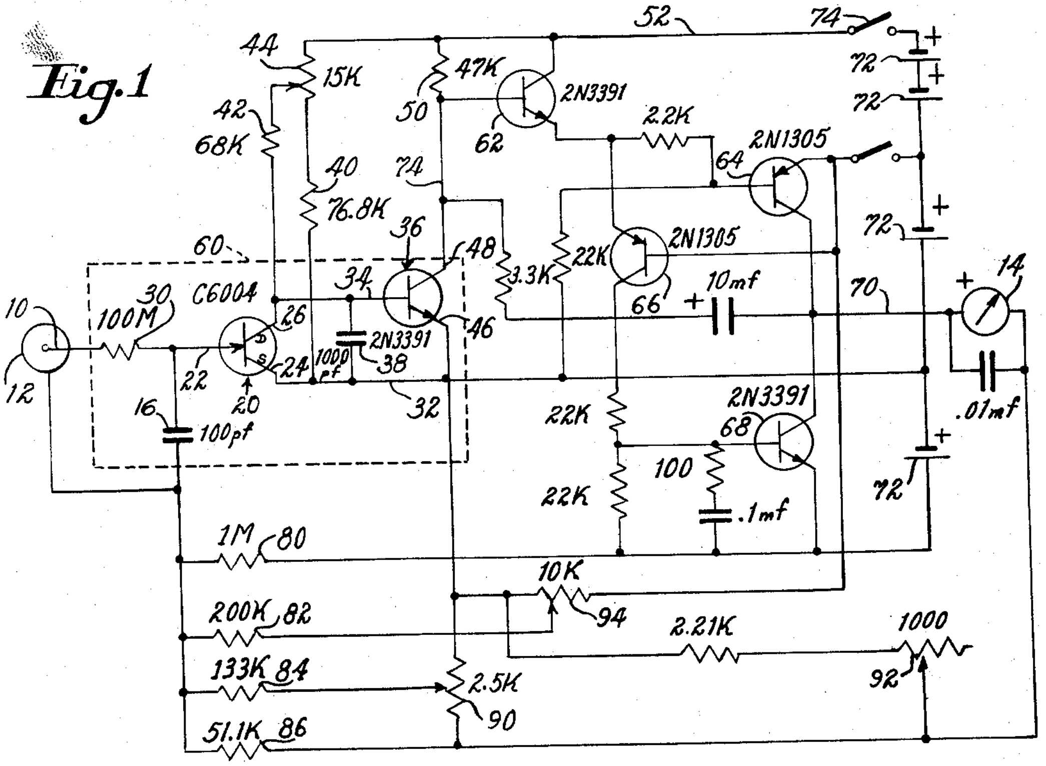

This invention relates to electronic circuitry and, more particularly, to high performance DC amplifiers.

It is an object of this invention to provide a novel and improved high performance DC amplifier. Two of the more important figures of merit on high performance DC amplifiers are the stability of input current and the stability of input voltage offset. In the measurement of pH values, for example, it is practically essential that the DC amplifier have a maximum error current of less than $10^{-12}$ amperes. Typically, such an amplifier has been achieved through the use of either a direct coupled electrometer circuit or a high impedance chopper amplifier, and it is an object of this invention to provide a high performance DC amplifier which employs a field effect transistor.

Another object of the invention is to provide a novel high performance DC amplifier having an error current change of less than $10^{-14}$ amperes per degree centigrade.

A further object of the invention is to provide high performance DC amplifier circuitry employing a field effect transistor in which the error current is several orders of magnitude less than the nominal gate leakage current of the transistor.

Still another object of the invention is to provide a high performance DC amplifier having an offset voltage less than 100 microvolts.

Another object of the invention is to provide a high performance DC amplifier having improved temperature coefficient characteristics.

A specific object of the invention is to provide a field effect transistor circuit in an operational amplifier in which the effect of temperature on offset current and offset voltage is substantially eliminated.

In accordance with the invention, there is provided a high performance DC amplifier that utilizes a field effect transistor of the junction type in its input stage. This field effect transistor is operated with a lower than usual source-drain potential (less than two volts) and the gate electrode of this field effect transistor is forward biased and operated at its floating potential (the potential giving substantially zero gate current) rather than being reverse biased, which is effective to broaden the region in which the circuitry exhibits high input impedance with gate current offset and gate potential offset that are substantially independent of temperature. An amplifier constructed in accordance with the invention has a temperature coefficient of offset current of $10^{-14}$ amperes per degree centigrade. In a particular embodiment of the invention, the source-drain potential is supplied by the emitter base junction of a transistor which provides a voltage source in the order of 500 millivolts in magnitude. In another form of the invention, a double gate field effect transistor is utilized and the second gate electrode has an adjustable biasing control connected to it which enables the transistor circuit to be operated in a region which exhibits offset voltage and offset current that have zero temperature coefficient characteristics at the same operating point.

Figure 2:
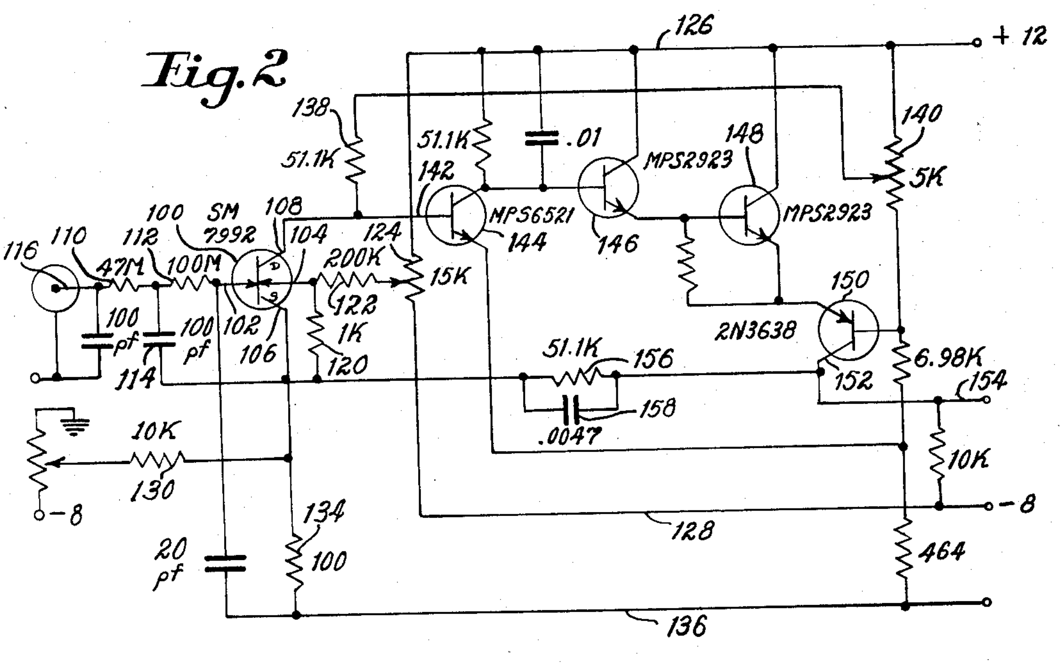

Other objects, features and advantages of the invention will be seen as the following description of particular embodiments thereof progresses, in conjunction with the drawing, in which:

FIG. 1 is a schematic diagram of a DC amplifier circuit constructed in accordance with the invention for use with a pH meter; and FIG. 2 is a schematic diagram of a second form of amplifier circuit constructed in accordance with the invention.

With reference to FIG. 1, there is provided an amplifier circuit adapted to receive on a cable having a center conductor 10 and as shield 12 a signal from a pH electrode (which has an impedance in the order of $10^{10}$ ohms) for amplification to operate an output device (meter 14). Capacitor 16 functions to minimize high frequency coupling between conductor 10 and shield 12. This amplifier circuit utilizes a junction type field effect transistor 20 that has a gate electrode 22, a source electrode 24, and a drain electrode 26. A junction field effect transistor of this type may include a conductive channel of either N type or P type semiconductor material which is bounded on both sides with semiconductor material of the opposite type. The source electrode 24 is connected to one end of the channel, the drain electrode 26 is connected to the other end of the channel, and the gate electrode 22 is connected to the semiconductor material of the opposite type that bounds the channel.

The gate electrode 22 is connected to the input line 10 through resistor 30, the source electrode 24 is connected to common bus 32, and the drain electrode is connected to the base electrode 34 of silicon NPN transistor 36. A capacitor 38 is connected between the source and drain electrodes and a bias adjusting network of resistors 40 and 42 and adjusting potentiometer 44 is also connected across the source and drain electrodes. The emitter electrode 46 of transistor 36 is connected to common bus 32 so that its emitter-base junction regulates the voltage across the source-drain channel of the field effect transistor 20. The collector electrode 48 of transistor 36 is connected through resistor 50 to positive voltage bus 52.

The output signal from the input stage of this amplifier (indicated by the dashed line 60) is supplied to a bilateral class B amplifier circuit that includes transistors 62, 64, 66 and 68. The output of the bilateral amplifier is supplied over line 70 to the meter 14.

The open loop input impedance of this circuit is 3,00( megohms and the amplifier has a feedback value of abou 4,000 so that the closed loop input impedance is in exces of $10^{13}$ ohms (the characteristics of which approach thos of electrometer circuits). Potentiometric feedback is employed, the feedback path being through meter 14 (50( microampere movement) and the network of resistor 80, 82, 84, 86 to the shield 12 of the input cable. In th feedback loop potentiometer 90 permits adjustment c the impedance of the feedback loop as a function of temperature and provides a full-scale adjustment, potentiometer 92 varies the value of load resistance that the mete 14 sees, and potentiometer 94 provides an adjustment fc zeroing the meter.

The forward biased condition of the gate electrode 2 is established by adjusting the source drain current by means of the potentiometer 44, which adjustment affects the source-gate voltage.

The value of each battery 72 is 1.35 volts and the two upper batteries are connected to the circuit by means of a ganged power switch unit 74.

This circuitry arrangement is used in a battery operated pH meter in which the energy requirements are minimized. The circuitry is a DC amplifier which includes a direct coupled field effect transistor in its input stage 60. The gate electrode 22 of this field effect transistor is forward biased so that the gate electrode is maintained at its floating potential. The input signal on line 10 varies less than one millivolt to produce a full scale reading on meter 14. The voltage across the source-drain channel of the field effect transistor is controlled by the emitter base junction of transistor 36 which produces a voltage drop in the order of 550–650 millivolts. When potentiometer 44 is properly adjusted, this circuitry exhibits a zero current offset characteristic with a typical temperature coefficient of $10^{-14}$ ampere per degree centigrade. When operating in this manner, the floating gate potential will be a nearly constant potential which lies between 3 to 100 millivolts positive in an N channel junction field effect transistor.

A second embodiment of the invention is shown in FIG. 2. This circuitry employs a field effect transistor 100 of the double gate type. That transistor has a first gate 102 and a second gate 104, a source electrode 106, and a drain electrode 108. The first gate electrode 102 is coupled to one side of the source-drain channel of the transistor 100 while the second gate electrode 104 is coupled to the opposite side of the source-drain channel. Gate electrode 102 is coupled through a hum filter including resistors 110 and 112 and capacitor 114 to the input line 116. The second gate electrode is connected through a resistor network including resistors 120, 122, and potentiometer 124. The fixed terminals of potentiometer 124 connected respectively to a +12 volt bus 126 and a −8 volt bus 128. The source electrode 106 is connected through resistor 130 to an offset voltage control potentiometer 132 and through resistor 134 to common bus 136. The drain electrode 108 is connected through resistor 138 to offset current control potentiometer 140 and to the base electrode 142 of transistor 144.

Transistor 144 is the first stage of a four-stage transistor amplifier having further transistors 146, 148 and 150. The collector electrode 152 of transistor 150 is connected to output line 154. Also connected to collector electrode 152 is a feedback circuit which includes resistor 156 and capacitor 158 which are connected to the source electrode 106 of field effect transistor 100.

Potentiometer 124 provides a bias voltage to gate electrode 104 which enables control of the drain current and in turn enables an operating point of the transistor to be established which has temperature coefficient characteristics with respect to both voltage offset and current offset that approach zero, the voltage offset being 30 microvolts/° C. over the range 0–50° C. and the current offset being $10^{-14}$ ampere/° C. This circuitry is particularly useful as an input amplifier stage for a pH meter or similar application where the input voltage operating point is nearly constant.

While particular embodiments of the invention have been shown and described, various modifications thereof will be apparent to those skilled in the art and, therefore, it is not intended that the invention be limited to the disclosed embodiments or to details thereof and departures may be made therefrom within the spirit and scope of the invention as defined in the claims.

What is claimed is:

1. In a high performance DC amplifier, an input stage comprising a field effect transistor of the junction type having a source electrode, a drain electrode, and a gate electrode, means to apply across said source and drain electrodes a source-drain potential of less than two volts and circuit means for controlling the current flow in said drain electrode to establish a forward biased condition on said gate electrode so that said gate electrode is maintained at its floating potential, said input amplifier stage having a temperature coefficient of offset current in the order of less than $10^{-12}$ ampere per degree centigrade over the range 0–50° C.

2. The apparatus as claimed in claim 1 and further including a transistor having an emitter-base junction, said emitter-base junction being directly connected across the source and drain electrodes of said field effect transistor to control said source-drain potential.

3. The apparatus as claimed in claim 1 wherein said field effect transistor includes a second gate electrode, said second gate electrode being connected to the substrate material of said field effect transistor on the opposite side of the source-drain channel from the connection of the first gate electrode, and further including means to adjust the potential on said second gate electrode to control the current flow at said drain electrode so that the temperature coefficients of offset current and offset voltage both approach zero at the same operating point.

4. The apparatus as claimed in claim 3 wherein said potential adjusting means includes a potentiometer connected to said second gate electrode.

5. The apparatus as claimed in claim 4 wherein said input stage is one stage of an amplifier that has an output, and further including a feedback loop connected between said output and the input of said input stage.

6. The apparatus as claimed in claim 1 wherein said circuit means includes adjustable means for controlling the current flow in the source-drain channel of said transistor.

7. The apparatus as claimed in claim 6 wherein said adjustable means is a potentiometer connected in series with said source-drain channel.

8. The apparatus as claimed in claim 7 and further including a transistor having an emitter-base junction, said emitter-base junction being directly connected across the source and drain electrodes of said field effect transistor to control said source-drain potential.

9. The apparatus as claimed in claim 8 wherein said input stage is one stage of an amplifier that has an output, and further including a potentiometric feedback loop connected between said output and the input of said input stage to provide a closed loop input impedance in excess of $10^{13}$ ohms.

References Cited

"Biasing UNIFETs to Give Zero DC Drift," Application Note of Siliconix, Inc., July 1963.

"Simplify DC Amplifier Design," Electronic Design, Feb. 1, 1966, pp. 64–68.

ROY LAKE, *Primary Examiner.*

J. B. MULLINS, *Assistant Examiner.*

U.S. Cl. X.R.

330—28, 35, 108

UNITED STATES PATENT OFFICE
CERTIFICATE OF CORRECTION

Patent No. 3,416,093 December 10, 1968

David E. Blackmer

It is certified that error appears in the above identified patent and that said Letters Patent are hereby corrected as shown below:

Column 2, line 24, "as" should read -- a --. Column 3, line 23, after "which" insert -- typically --.

Signed and sealed this 10th day of March 1970.

(SEAL)
Attest:

Edward M. Fletcher, Jr.
Attesting Officer

WILLIAM E. SCHUYLER, JR.
Commissioner of Patents